(12) United States Patent
Renn et al.

(10) Patent No.: US 11,355,723 B2
(45) Date of Patent: Jun. 7, 2022

(54) LIGHT-EMITTING ELEMENT AND LIGHT-EMITTING DEVICE COMPRISING THE SAME

(71) Applicant: EPISTAR CORPORATION, Hsinchu (TW)

(72) Inventors: Yih-Hua Renn, Hsinchu (TW); Shau-Yi Chen, Hsinchu (TW); Ching-Tai Cheng, Hsinchu (TW); Aurelien Gauthier-Brun, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 17/020,218

(22) Filed: Sep. 14, 2020

(65) Prior Publication Data

US 2021/0013443 A1 Jan. 14, 2021

Related U.S. Application Data

(63) Continuation of application No. 16/232,297, filed on Dec. 26, 2018, now Pat. No. 10,777,764.

(30) Foreign Application Priority Data

Dec. 25, 2017 (TW) ................................ 106145576
Dec. 25, 2018 (TW) ................................ 107146875

(51) Int. Cl.
*H01L 51/50* (2006.01)
*H01L 33/26* (2010.01)
*H01L 33/40* (2010.01)
*C09K 11/77* (2006.01)
*H01L 33/62* (2010.01)
(Continued)

(52) U.S. Cl.
CPC ...... *H01L 51/5036* (2013.01); *C09K 11/7774* (2013.01); *H01L 33/26* (2013.01); *H01L 33/40* (2013.01); *H01L 33/504* (2013.01); *H01L 33/62* (2013.01); *H01L 51/56* (2013.01)

(58) Field of Classification Search
CPC ..... H01L 51/5036; H01L 33/26; H01L 33/40; H01L 33/504; H01L 33/62; H01L 51/56; H01L 33/00–648; H01L 27/15–156; H01L 2933/00–0091
See application file for complete search history.

(56) References Cited

U.S. PATENT DOCUMENTS

2011/0272666 A1 11/2011 Hung
2012/0181569 A1 7/2012 Choi
(Continued)

FOREIGN PATENT DOCUMENTS

CN 204497261 U 7/2015
CN 105428494 A 3/2016

*Primary Examiner* — Shahed Ahmed
(74) *Attorney, Agent, or Firm* — Muncy, Geissler, Olds & Lowe, P.C.

(57) ABSTRACT

A light-emitting device includes a light-emitting element having a first electrode and a second electrode, a carrier, a first contact and a second contact. The first contact is arranged on the carrier and is electrically connected to the first electrode. The second contact is arranged on the carrier and is electrically connected to the second electrode. The first contact has a contour similar with that of the first electrode. The second contact has a contour similar with that of the second electrode.

20 Claims, 5 Drawing Sheets

(51) Int. Cl.
    *H01L 51/56*     (2006.01)
    *H01L 33/50*     (2010.01)

(56) References Cited

U.S. PATENT DOCUMENTS

| | | | |
|---|---|---|---|
| 2015/0060911 A1* | 3/2015 | Chien | H01L 33/62 257/98 |
| 2015/0263234 A1* | 9/2015 | Cho | H01L 27/153 257/88 |
| 2015/0349231 A1 | 12/2015 | Hsieh | |
| 2016/0240758 A1* | 8/2016 | Huang | H01L 33/62 |
| 2017/0068386 A1 | 3/2017 | Lai | |
| 2019/0319165 A1* | 10/2019 | Zou | H01L 25/0753 |

\* cited by examiner

LIGHT-EMITTING ELEMENT AND LIGHT-EMITTING DEVICE COMPRISING THE SAME

CROSS REFERENCE TO RELATED APPLICATIONS

This application is a continuation application of U.S. patent application Ser. No. 16/232,297, filed on Dec. 26, 2018, which claims priority of Taiwan Patent Application No. 106145576 filed on Dec. 25, 2017 and Taiwan Patent Application No. 107146875 filed on Dec. 25, 2018 the entirety of which is incorporated by reference herein.

TECHNICAL FIELD

The present disclosure relates to a light-emitting device, and more relate to a light-emitting device having an electrode and a contact having a contour similar with that of the electrode.

DESCRIPTION OF THE RELATED ART

The light-emitting diode (LED) used in the solid-state lighting device has the characteristics of low power consumption, long operating life, and small volume, so the LED gradually replaces the traditional lighting source.

The LED can be attached to a carrier by a conductive material (for example, solder) to form a light-emitting device. However, the position of the LED may be shifted during the manufacturing process because the conductive material might flow during the curing process. Therefore, the LED cannot be arranged on the correct position.

The light-emitting device mentioned above can include a sub-mount and a solder on the sub-mount to fix the LED on the sub-mount. The LED can be electrically connected to the circuit on the sub-mount. The sub-mount can be a lead frame or a mounting substrate.

SUMMARY OF THE DISCLOSURE

The following description illustrates embodiments and together with drawings to provide a further understanding of the disclosure described above.

A light-emitting device includes a light-emitting element having a first electrode and a second electrode, a carrier, a first contact and a second contact. The first contact is arranged on the carrier and is electrically connected to the first electrode. The second contact is arranged on the carrier and is electrically connected to the second electrode. The first contact has a contour similar with that of the first electrode. The second contact has a contour similar with that of the second electrode.

The light-emitting device includes a light-emitting element, a carrier, a first contact, and a second contact. The light-emitting element has a first electrode having a first contour and a second electrode surrounded by the first electrode. The second electrode has a second contour different from the first contour. The first contact is formed on the carrier and is electrically connected to the first electrode. The second contact is formed on the carrier and is electrically connected to the second electrode. The second contact has a third contour.

The light-emitting device includes a light-emitting element, a carrier, a first contact, a second contact. The light-emitting element has a first electrode having a first contour, a second electrode surrounded by the first electrode and having a second contour, and a first insulation portion arranged between the first electrode and the second electrode and having a fourth contour. The first contact is formed on the carrier and is electrically connected to the first electrode. The second contact is formed on the carrier and is electrically connected to the second electrode. The second contact has a third contour having a dimension not larger than a dimension of the fourth contour.

DETAILED DESCRIPTION OF THE EMBODIMENTS

The drawings illustrate the embodiments of the application and, together with the description, serve to illustrate the principles of the application. The same name or the same reference number given or appeared in different paragraphs or figures along the specification should has the same or equivalent meanings while it is once defined anywhere of the disclosure. The thickness or the contour of an element in the specification can be expanded or narrowed.

Figure 1:
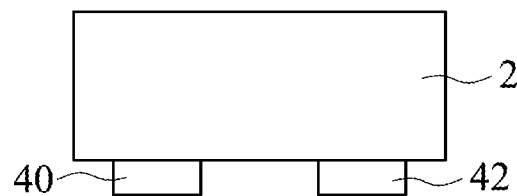
FIG. 1 shows a cross-sectional view of a light-emitting element in accordance with an embodiment of the present disclosure.

FIG. 1 shows a cross-sectional view of a light-emitting element in accordance with an embodiment of the present disclosure. Referring to FIG. 1, the light-emitting element 10 has a semiconductor stack 2, a first electrode 40, and a second electrode 42. The first electrode 40 and the second electrode 42 are physically separated from each other without being contacted with each other. For example, the first electrode 40 is not overlapped with the second electrode 42. In another embodiment, the first electrode 40 is overlapped with the second electrode 42 with an insulation layer formed therebetween. In another embodiment, an insulation portion (not shown) is formed between the first electrode 40 and the second electrode 42. The semiconductor stack has a first conductive type semiconductor layer (not shown), a second conductive type semiconductor layer (not shown), and a light-emitting layer (not shown) arranged between the first conductive type semiconductor layer and the second conductive type semiconductor layer. The light-emitting layer emits incoherent light. The first conductive type semiconductor layer is electrically connected to the first electrode 40, and the second conductive type semiconductor layer is electrically connected to the second electrode 42.

The first conductive type semiconductor layer and the second conductive type semiconductor layer can be cladding layer or confinement layer which provides electrons and holes respectively to be recombined for the active layer to emit a light. The material of the first conductive type semiconductor layer, the light-emitting layer, and the second conductive type semiconductor layer can be III-V semiconductor materials, such as $Al_xIn_yGa_{(1-x-y)}N$ or $Al_xIn_yGa_{(1-x-y)}P$, wherein $0 \leq x, y \leq 1$ and $(x+y) \leq 1$. The light-emitting element 10 can emit a red light having a peak wavelength between 610 nm and 650 nm, a green light having a peak wavelength between 530 nm and 570 nm, or a blue light having a peak wavelength between 450 nm and 490 nm.

The material of the electrodes 40, 42 can be metal, such as titanium (Ti), nickel (Ni), gold (Au), platinum (Pt) or aluminum (Al). In an embodiment, the electrode 40, 42 can be a multi-layer structure having a stack of Ti/Al/Ni/Al/Ni/Al/Ni/Au, Ti/Al/Ti/Al/Ni/Au, or Ti/Pt/Al/Ni/Al/Ni/Au, wherein the Ti stands for a titanium metal layer, Ni stands for a nickel metal layer, Au stands for a gold metal layer, Pt stands for a platinum metal layer, and Al stands for an aluminum metal layer. The gold metal layer is arranged to be the bottommost layer in the stack for directly connection with an external element.

Optionally, the light-emitting element 10 has a wavelength conversion material (not shown) covering the semiconductor stack 2. The wavelength conversion material absorbs and converts a first light from the semiconductor stack 2 to be a second light having a peak wavelength or a dominant wavelength different from that of the first light. The material of the wavelength material can be quantum dot material, yellow-green phosphor, red phosphor or blue phosphor. The material of the yellow-green phosphor can be YAG, TAG, citrate, vanadate, alkaline earth metal selenide, or metal nitride. The material of the red phosphor can be fluoride (for example, $K_2TiF_6:Mn^{4+}$ or $K_2SiF_6:Mn^{4+}$), citrate, vanadate, alkaline earth metal sulfide, metal oxynitride or a mixture of tungstate and molybdate. The material of the blue phosphor can be $BaMgAl_{10}O_{17}:Eu^{2+}$. In an embodiment, the first light and the second light are mixed to be white light. The white light has a color coordinate (x,y) on the CIE 1931 chromaticity diagram, wherein the $0.27 \leq x \leq 0.285$, and $0.23 \leq y \leq 0.26$. In an embodiment, the white light has a color temperature in a range between 2200K~6500K (for example. 2200K, 2400K, 2700K, 3000K, 5700K, 6500K) and a color coordinate (x,y) locates within an area of 7 MacAdam ellipse on the CIE 1931 chromaticity diagram. In an embodiment, the first light and the second light are mixed to be non-white light, for example, red light, amber light, violet light or yellow light. In an embodiment, all or most of the first light is converted to the second light.

The quantum dot material has a core and a shell. The material of the core and the shell can be different. The material of the shell has an energy band gap higher than that of the material of the core to avoid excessive electrons dissipated from the core while emitting light repeatedly and to avoid the declination of the intensity of the light from the quantum dot material. The material the core can be zinc sulfide (ZnS), zinc selenide (ZnSe), zinc telluride (ZnTe), zinc oxide (ZnO), cadmium sulfide (CdS), cadmium selenide (CdSe), cadmium telluride. (CdTe), gallium nitride (GaN), gallium phosphide (GaP), gallium selenide (GaSe), gallium antimonide (GaSb), gallium arsenide (GaAs), aluminum nitride (AlN), aluminum phosphide (AlP), aluminum arsenide (AlAs), indium phosphide (InP), indium arsenide (InAs), tellurium (Te), lead sulfide (PbS), indium antimonide (InSb), lead telluride (PbTe), lead selenide (PbSe), antimony telluride (SbTe), zinc cadmium selenide (ZnCdSe), zinc cadmium selenide sulfide (ZnCdSeS), and copper indium sulfide (CuInS). The material of the core should match the material of the shell. For example, the lattice constant of the core is matched with the lattice constant of the shell. In addition, the material of the shell should be able to form a high energy band gap area around the core to increase quantum yield. In order to satisfy both properties at the same time, the structure and/or the composition of the shell can be modified to lower the stress between the core and the shell and to increase the energy band gap. The structure of the shell can be a single layer, a multilayer or a structure having a gradually varied composition. In an embodiment, the core is CdSe and the shell has an inner portion having ZnCdSeS and an outer portion having ZnS. In another embodiment, the core is CdSe and the shell has an inner portion having ZnCdSeS, an outer portion having ZnS and a middle portion having a gradually varied composition of $Zn_{0.25}Cd_{0.75}S/Zn_{0.5}CdS/Zn_{0.75}Cd_{0.25}S$.

In an embodiment, the light-emitting element 10 has a carrier to support the light-emitting layer. In an embodiment, the carrier is a growth substrate for epitaxial growth. The material of the substrate can be sapphire, GaN, Si, or SiC. It is suitable to form III-V or II-VI semiconductor materials on the epitaxial growth substrate by the epitaxial growth technology, and the semiconductor materials can be used as light-emitting layer. In another embodiment, the carrier is not a growth substrate for growing the light-emitting layer and is used as a support element for changing or supporting the growth substrate. The support element can be a structure having a material, a composition or a contour different from that of the growth substrate.

Figure 2:
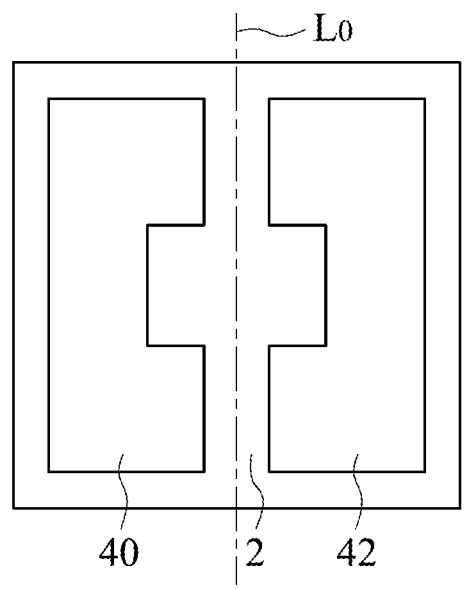
FIG. 2 shows a bottom view of a light-emitting element shown in FIG. 1.

FIG. 2 shows a bottom view of a light-emitting element 10 shown in FIG. 1. The first electrode 40 has a contour similar with that of the second electrode 40. The first electrode 40 and the second electrode 42 are symmetrically arranged with respect to a virtual line LO without being overlapped with the virtual line LO. The virtual line LO is an imaginary line for illustrative purpose and can't be seen by human eye. The virtual line LO is overlapped with the geometric center (not shown) of the light-emitting element 10. Referring to FIG. 2, the contour of the semiconductor stack 2 and that of the light-emitting layer within (not shown) are rectangular. The light-emitting layer provides a rectangular light field. In an embodiment, the shortest distance between the first electrode 40 and the second electrode 42 is larger than 150 μm.

Figure 3:
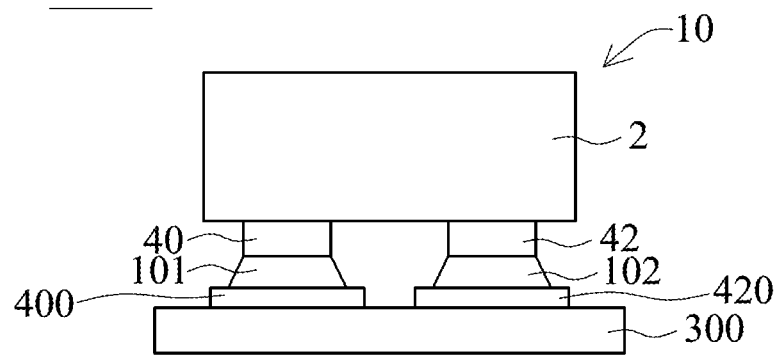
FIG. 3 shows a cross-sectional view of a light-emitting element in accordance with an embodiment of the present disclosure.

FIG. 3 shows a cross-sectional view of a light-emitting device in accordance with an embodiment of the present disclosure. Referring to FIG. 3, the light-emitting device 1000 has a semiconductor stack 2, a first electrode 40, a second electrode 42, conductive layers 101 and 102, a first contact 400, a second contact 420, and a carrier 300. The carrier 300 has circuit (not shown) to be electrically connected to the first electrode 40 and the second electrode 42.

Figure 4:
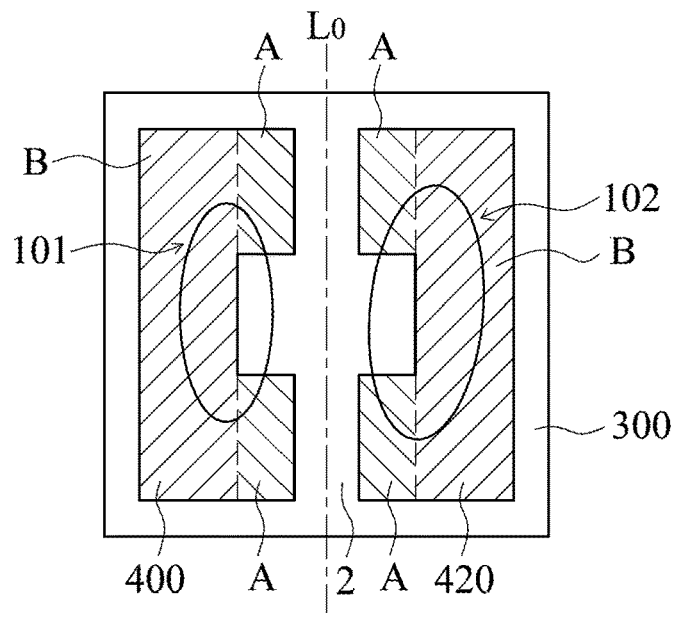
FIG. 4 shows a top view of a carrier shown in FIG. 3.

The external power source can provide electricity through the conductive layers 101, 102 and the electrodes 40, 42 to the light-emitting device 1000 to emit a light. Referring to FIG. 4, FIG. 4 shows the positions of the conductive layers 101 and 102 on the carrier 300 shown in FIG. 3, and the semiconductor 2, the first electrode 40, and the second electrode 42 are omitted. The first contact 400 and the second contact 420 are arranged on the top surface of the carrier 300 and are electrically connected to the semiconductor stack 2 through the conductive layers 101 and 102. The contours of the conductive layers 101, 102 on the first contact 400 and the second contact 420 can be different, and the conductive layers 101, 102 are arranged on the first contact 400 and the second contact 420 asymmetrically with respect to the virtual line LO. Alternatively, the first contact 400 has a contour similar with that of the second contact 420, and the first contact 400 and the second contact 420 are symmetrically arranged with respect to a virtual line LO without overlapping with the virtual line LO. The first contact 400 has a contour similar with that of the first electrode 40, and the second contact 420 has a contour similar with that of the second electrode 42. The first contact 400 and the second contact 420 are electrically connected to the circuit (not shown) on the carrier 300. The conductive layer 101 is electrically connected to the first electrode 40 and the first contact 400. The conductive layer 102 is electrically connected to the second electrode 42 and the second contact 420. The semiconductor stack 2 is fixed on the carrier 300. It is noted that the conductive layers 101, 102 are contacted with the first contact 400, the second contact 420 and the region on the carrier 300 not covered by the first contact 400 or the second contact 420. The adhesion strength between the conductive layers 101 and the first contact 400 and the adhesion strength between the conductive layer 102 and the second contact 420 are larger than that between the conductive layer 101, 102 and the region on the carrier 300 not covered by the first contact 400 or the second contact 420. Good adhesion between the conductive layers 101, 102 and the contacts 400, 420 can avoid the conductive layers 101, 102 from aggregating on the region of the carrier 300 that is not covered by the first contact 400 or the second contact 420 during the manufacturing process. So, the open circuit between the semiconductor stack 2 and the carrier 300 resulted from the absence of the conductive layers 101, 102 on the first contact 400 or on the second contact 420 can be avoided. Besides, good adhesion also prevents the conductive layer 101, 102 from peeling off from the first contact 400, the second contact 420 or the surface of the carrier 300. Furthermore, the light-emitting element 10 and the conductive layers 101, 102 are prevented from being separated from the carrier 300. In an embodiment, the shortest distance between the first contact 400 and the second contact 420 is larger than 150 μm.

FIG. 4 shows a top view of a carrier shown in FIG. 3. Referring to FIG. 4, the first contact 400 (or the second contact 420) has a branch portion (region A) and a body portion (region B). During manufacturing, the conductive material is arranged to cover the first contact 400 and the second contact 420. The conductive material may be solder or other adhesive material having conductive properties. The light-emitting element 10 is pressed and fixed on the first contact 400 and the second contact 420, and the conductive material is cured to be the conductive layers 101, 102. It is noted, during the process of pressing the light-emitting element 10, the amount of the conductive material on the first contact 400 and the amount of the conductive material on the second contact 420 can be different, and the pressure on the first contact 400 and the pressure on the second contact 420 can be different because of the difference between the roughness on the first contact 400 and the roughness on the first contact 420. Then, the conductive material on the first contact 400 and/or on the second contact 420 flows and the contours of the conductive layer 101 and the conductive layer 102 are different as shown in FIG. 4. So, considering that the adhesion strength between the conductive material and the first contact 400 and the adhesion strength between the conductive material and second contact 420 are larger than adhesion strength between the conductive material and the carrier 300, each of the first contact 400 and the second contact 420 is designed to have a region A and a region B in this embodiment. The structure allows the conductive material to flow on the region with larger adhesion strength (for example, the region A and/or the region B), and not to flow around the region with smaller adhesion strength (for example, the surface of the carrier 300 not covered by the first contact 400 or by the second contact 420). So, the conductive material (or the conductive layer 101, 102) is kept between the first contact 400 and the electrode 40 and between the second contact 420 and the electrode 42.

It is noted that the maximum width of the branch portion (region A) is smaller than the maximum width of the body portion (region B). In other words, the branch portion contains less conductive material than the body portion does. So, the short circuit formed between the contact 400 and the contact 420 by the conductive material is avoided. At the same time, the short circuit formed between one electrode of the light-emitting element 10 (for example, the first electrode 40 or the second electrode 42) and the two contacts (for example, the first contact 400 and the second contact 420) is less likely to happen, even the position of the light-emitting element 10 is shifted caused by the excessive conductive material.

The conductive material can be solder or anisotropic conductive paste (ACP). The anisotropic conductive paste has conductive paste, such as a paste having micro-tin ball or an ultra-fine pitch fixed array ACP. The paste having micro-tin ball can be particle-aligned anisotropic conductive film (PAL-ACF), Anisotropic Conductive film (ACF), Self Assembly Anisotropic Conductive Paste (SAP), or epoxy solder pate.

Figure 5:
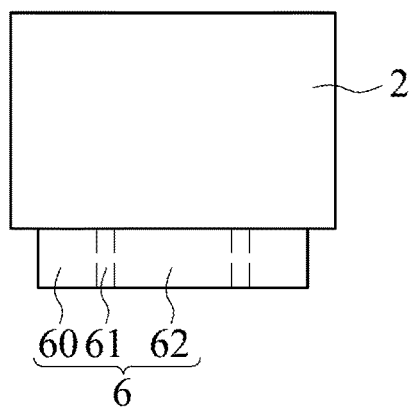
FIG. 5 shows a cross-sectional view of a light-emitting element in accordance with an embodiment of the present disclosure.
Figure 6:
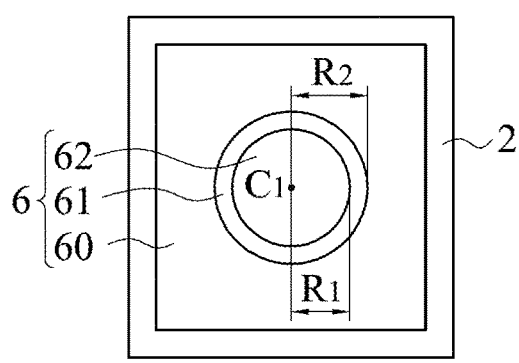
FIG. 6 shows a bottom view of a light-emitting element shown in FIG. 5.

FIG. 5 shows a cross-sectional view of a light-emitting element in accordance with an embodiment of the present disclosure. The light-emitting element 20 has a semiconductor 2 and an electrode portion 6. The electrode portion 6 has a first electrode 60, a second electrode 62, and a first insulation portion 61 between the first electrode 60 and the second electrode 62. The details of the semiconductor 2 can be referred to relevant sections disclosed above and are omitted for brevity. The electrode portion 6 is protruded from the semiconductor 2 and has a substantially flat surface on the side away from the semiconductor 2. FIG. 6 shows a bottom view of a light-emitting element shown in FIG. 5. Referring to FIG. 6, the electrode portion 6 has a rectangular contour. The contours of the second electrode 62 and the first insulation portion 61 surrounding the second electrode 62 in a plane view shown in FIG. 6 are circles. The circles form a concentric structure. The concentric structure has a center C1 in a plane view shown in FIG. 6. The first electrode 60, the second electrode 62 and the first insulation portion 61 are protruded from the semiconductor stack 2 and have substantially flat outer surfaces being coplanar with each other for electrically connection with external elements. The height of the first electrode 60, the height of the second electrode 62 and the height of the first insulation portion 61 are substantially the same. In an embodiment, the center C1 of the second electrode 62 is overlapped with the geometric center of the light-emitting element 20. The second electrode 62 has a radius R1 measured from the center C1, and the first insulation portion 61 has a radius R2 measured from the center C1. The first electrode 60 and the second electrode 62 are physically separated from each other by the first insulation portion 61. The first electrode 60 and the second electrode 62 are not contacted with each other or overlapped with each other. The first electrode 60 and the second electrode 62 are electrically connected to semiconductor layers of different conductive types in the semiconductor stack 2 respectively. The first insulation portion 61 surrounds the second electrode 62 and has a similar contour compared with the second electrode 62. In an embodiment, the first insulating portion 61 has a similar contour compared to the second electrode 62, such as a circular shape or an elliptical shape. In another embodiment, both of the contour of the first insulating portion 61 and that of the second electrode 62 can be a quadrangular shape, a triangular shape, a polygonal shape, or a closed curve shape. Referring to FIG. 6, the contour of the first electrode 60 is similar to that of the semiconductor stack 2, and the outer edge of the first electrode 60 is not overlapped with that of the semiconductor stack. The light-emitting element 20 has a rectangular contour. The contours of the light-emitting stack 2 and that of the light-emitting layer (not shown) within the light-emitting stack 2 are similar with that of the light-emitting element 20. That is, the contours of the light-emitting stack 2 and that of the light-emitting layer (not shown) are rectangular. In an embodiment the narrowest width of the first insulation portion 61 is larger than 150 μm to avoid the short circuit resulted from the overlap of the first electrode 60 and the second electrode 62 during manufacturing.

The material of the first insulation portion 61 can be oxide, nitride or polymer. The oxide can be silicon oxide ($SiO_x$), titanium oxide ($TiO_x$), cerium oxide ($TaO_x$) or aluminum oxide ($AlO_x$). The nitride can be aluminum nitride ($AlN_x$) or silicon nitride ($SiN_x$). The polymer can be polyimide or benzocyclobutane (BCB). In an embodiment, the first insulation portion 61 has a repeated stack of an insulation layer with low refractive index and an insulation layer with high refractive index to form a distributed Bragg reflector (DBR).

Figure 7:
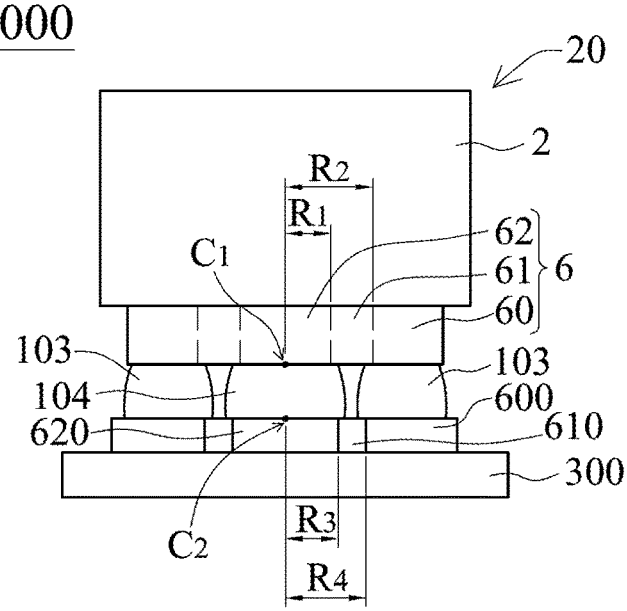
FIG. 7 shows a cross-sectional view of a light-emitting element in accordance with an embodiment of the present disclosure.
Figure 8:
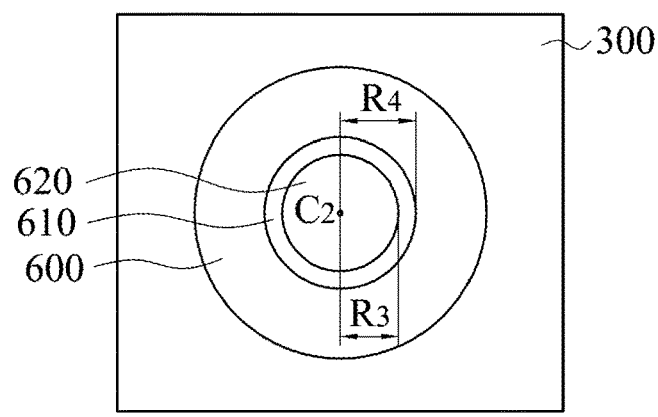
FIG. 8 shows a top view of a carrier shown in FIG. 7.

FIG. 7 shows a cross-sectional view of a light-emitting element in accordance with an embodiment of the present disclosure. FIG. 8 shows a top view of a carrier shown in FIG. 7. Referring to FIG. 7, the light-emitting device 2000 has a light-emitting element 20 fixed to the carrier 300 by the conductive layers 103, 104. Referring to FIG. 8, a first contact 600, a second contact 620 and a second insulation portion 610 between the first contact 600 and the second contact 620 are formed on the carrier 300. The outer surfaces of the first contact 600, the second contact 620, and the second insulation portion 610 are substantially coplanar with each other. The height of the first contact 600, the height of the second contact 620, and the height of the second insulation portion 610 are substantially the same. The contours of the first contact 600, the second insulation portion 610, and the second contact 620 in a plane view shown in FIG. 8 are circles. The circles form a concentric structure. The concentric structure has a center C2 in a plane view shown in FIG. 8. The second contact 620 has a radius R3 measured from the center C2, and the second insulation portion 610 has a radius R4 measured from the center C2. In an embodiment, the center C2 is overlapped with the geometric center of the carrier 300. In another embodiment, the narrowest width of the second insulation portion 610 is larger than 150 nm. In an embodiment, multiple light-emitting elements 20 can be arranged on the carrier 300. To be more specific, several sets of first contact 600, second contact 620 and second insulation portion 610 (separating the first contact 600 and the second contact 620) are arranged on the carrier 300. Therefore, the first contact 600 and the second contact 620 of one set are electrically connected to one light-emitting element 20. Referring to FIG. 7, the light-emitting element 20 is fixed to the carrier 300 by the conductive layers 103, 104. The first electrode 60 of the light-emitting element 20 is electrically connected to the first contact 600 by the conductive layer 103, and the second electrode 62 is electrically connected to the second contact 620 by the conductive layer 104. The position of the first insulation portion 61 between the first electrode 60 and the second electrode 62 substantially matches that of the second insulation portion 610 between the first contact 600 and the second contact 620. The material of the conductive layer 103, 104 can be solder or anisotropic conductive paste (ACP). Referring to FIG. 7, the edges of the conductive layers 103, 104 are curved. The position of the center C1 of the second electrode 62 substantially matches that of the center C2 of the second contact 620. In this embodiment, the contours of the first contact 600, the second contact 620 and the second insulation portion 610 are substantially circle. The radius R1 of the second electrode 62 is not larger than the radius R4 of the second insulation portion 610 to prevent the electrode 62 from being electrically connected to the first contact 600 and electrically connected to the second contact 620 at the same time. The radius R3 of the second contact 620 is not larger than the radius R2 of the first insulation portion 61 to prevent the second contact 620 from being electrically connected to the first electrode 60 and electrically connected to the second electrode 62 at the same time. The two sides of the conductive layers 103, 104 are connected to the light-emitting element 20 and the carrier 300 respectively. The adhesion strength between conductive layer 103 and the first contact 600 and the adhesion strength between conductive layer 104 and the second contact 620 are larger than the adhesion strength between the second insulation portion 610 and the conductive layers 103, 104 when the conductive layers 103, 104 are directly connected to the second insulation portion 610. The adhesion strength between conductive layer 103 and the first electrode 60 and the adhesion strength between conductive layer 104 and the second electrode 62 are larger than the adhesion strength between the first insulation portion 61 and the conductive layer 103, 104 when the conductive layer 103, 104 is directly connected to the first insulation portion 61. The outer surfaces of the first contact 600, the second contact 620, and the second insulation portion 610 are substantially coplanar with each other to match the surface of the electrode portion 6 of the light-emitting element 20. In an embodiment, the thickness of the first electrode 60 is different from that of the second electrode 62. Correspondingly, the surfaces of the second contact 620 and the second insulation portion 610 of the carrier 300 are more depressed than the surface of the first contact 600 for accommodating the protruded electrode portion 6. The conductive layer 104 is further filled in the depressed portion of the carrier 300. The second electrode 62 can be electrically connected with the second contact 620 through the conductive layer 104, and the conductive layer 103 electrically connects the first electrode 60 and the first contact 600.

Figure 9:
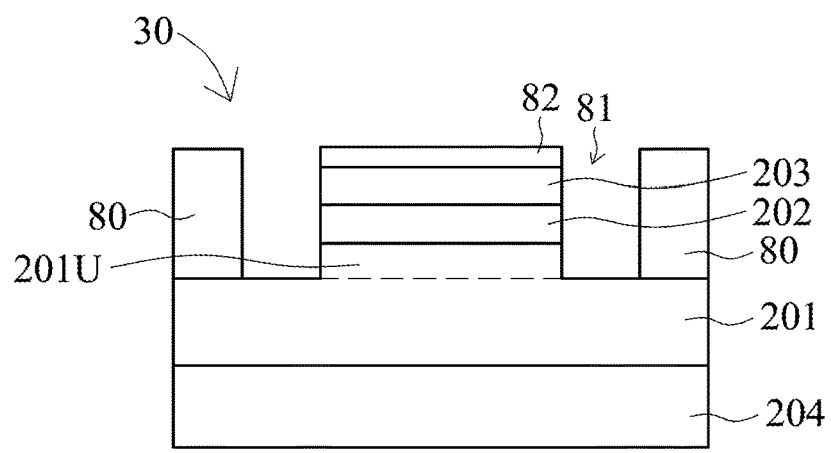
FIG. 9 shows a cross-sectional view of a light-emitting element in accordance with an embodiment of the present disclosure.
Figure 10:
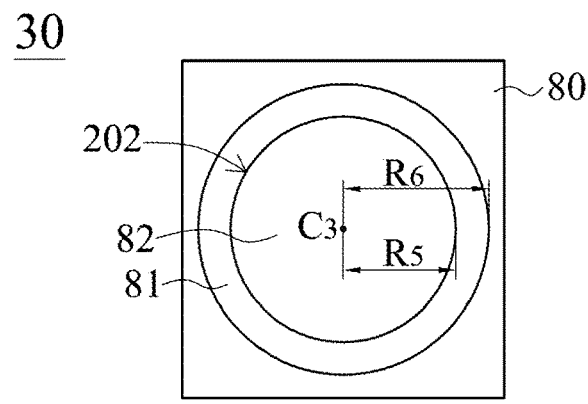
FIG. 10 shows a top view of the light-emitting element shown in FIG. 9.

FIG. 9 shows a cross-sectional view of a light-emitting element in accordance with an embodiment of the present disclosure. The light-emitting element 30 has a carrier 204, a first semiconductor layer 201, a light-emitting layer 202, a second semiconductor layer 203, a first electrode 80, a second electrode 82, and a depression portion 81 between the first electrode 80 and the second electrode 82. The first semiconductor layer 201 is a first conductive type semiconductor layer, and the second semiconductor layer 203 is a second conductive type semiconductor layer, wherein the first conductive type and the second conductive type can be n-type and p-type or p-type and n-type respectively. The first semiconductor layer 201 has a protruded portion 201U. The light-emitting layer 202 is formed on the protruded portion 201U to emit an incoherent light. In an embodiment, the top surface of the first semiconductor layer 201 is a substantially flat surface with a constant height, and the light-emitting layer 202 is formed on the substantially flat surface. The first semiconductor layer 201 is electrically connected to the first electrode 80, and the second semiconductor layer 203 is electrically connected to the second electrode 82. FIG. 10 shows a top view of the light-emitting element 30 shown in FIG. 9. Referring to FIG. 10, the second electrode 82 has a circular contour, and the depressed portion 81 surrounding the second electrode 82 has a circular contour substantially the same with the contour of the second electrode 82. The contours of the second electrode 82 and the depressed portion 81 surrounding the second electrode 82 in a plane view shown in FIG. 10 are circles. The circles form a concentric structure. The concentric structure has a center C3 in a plane view shown in FIG. 10. The second electrode 82 has a radius R5 measured from the center C3, and the depressed portion 81 has a radius R6 measured from the center C3. The depressed portion 81 has a substantially uniform width in a plane view as shown in FIG. 10. The light-emitting layer 202 has substantially the same contour as the second electrode 82, and has the same circular shape. The light-emitting element 30 has a circular light-emitting region. The contour of the first electrode 80 is not limited to the contour shown in FIG. 10, and the contour of the first electrode 80 can be circular or other shape formed by a closed curve line. Moreover, air is filled in the depressed portion 81. In an embodiment, the narrowest width of the depressed portion 81 is larger than 150 µm. In an embodiment, an insulating material is filled in the depressed portion 81 to electrically isolate the first electrode 80 and other portions, such as the light-emitting layer 202, the second semiconductor layer 203 and the second electrode 82. The depressed portion 81 can be fully filled by the insulating material or only a part of the depressed portion 81 is covered by the insulating material. For example, the sidewall of the first electrode 80 close to the light-emitting layer 202, the sidewall of the light-emitting layer 202 close to the first electrode 80, the sidewall of the second semiconductor layer 203 close to the first electrode 80 and/or the sidewall of the second electrode 82 close to the first electrode 80 can be covered by the insulating material in the depressed portion 81.

In an embodiment, the carrier 204 is an epitaxial growth substrate. The material of the epitaxial growth substrate can be sapphire, GaN, Si, or SiC. It is suitable to form III-V or II-VI semiconductor materials on the epitaxial growth substrate by the epitaxy growth technology, and the semiconductor materials can be used as light-emitting layer. In another embodiment, the carrier 204 is not a growth substrate for growing the light-emitting layer and is used as a support element for changing or holding the growth substrate. The support element can be a structure having a material, a composition or a contour different from that of the growth substrate.

Referring to FIG. 10, the light-emitting layer 202 has substantially the same contour as the second electrode 82 and has a circular contour to provide a circular light-emitting area. Therefore, the optical characteristics of the light-emitting element 202 are substantially the same in all directions, such as the light intensity, the dominant wavelength of the light from the light-emitting element 202 and/or the peak wavelength of the light from the light-emitting element 202. The circular contour of the light-emitting layer 202 is also beneficial to manufacturing. For example, during the process of fixing the light-emitting element 30 to the carrier, the circular second electrode 82 can be correctly connected to the conductive area on the carrier even the light-emitting element 30 rotates 45 degree from a predetermined position. Moreover, the first electrode 80 is not connected to the conductive region which is designed to be connected to the second electrode 82. On the contrary, if the contour of the electrode is not circular (for example, the electrode 40, 42 shown in FIG. 1), the electrode 40 and/or the electrode 42 may directly connect with the contact 400 and the contact 402 at the same time to form a short circuit if the light-emitting element 10 rotates (for example, rotates 45 degree from its predetermined position), and the light-emitting element 10 burns because of the short circuit.

Figure 11:
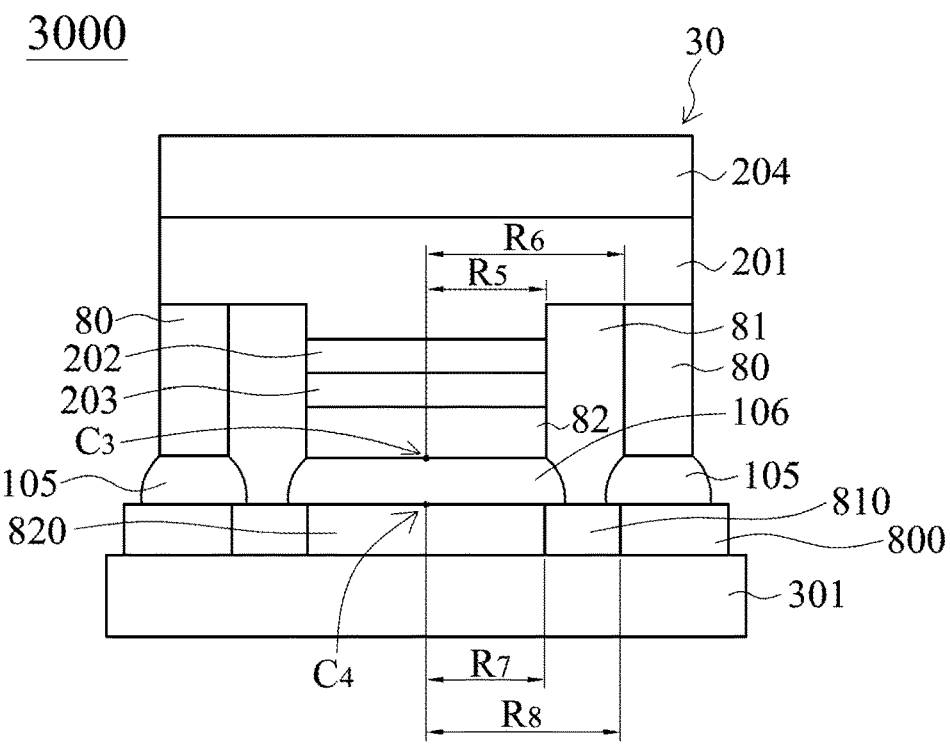
FIG. 11 shows a cross-sectional view of a light-emitting element in accordance with an embodiment of the present disclosure.
Figure 12:
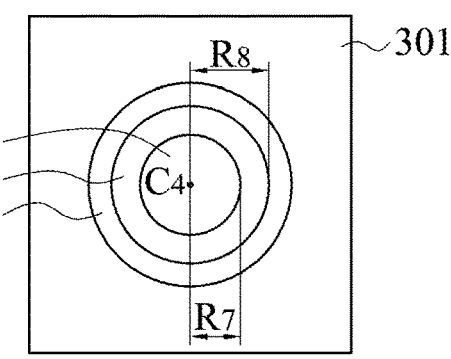
FIG. 12 shows a top view of the carrier shown in FIG. 11.

FIG. 11 shows a cross-sectional view of a light-emitting element in accordance with an embodiment of the present disclosure. FIG. 12 shows a top view of the carrier 301 shown in FIG. 11. The light-emitting device 3000 has a light-emitting element 30 fixed to the carrier 301 by the conductive layers 105, 106. The details of the light-emitting element 30 can be referred to relevant sections in the embodiments discussed above. No solid material is filled in the depressed portion 81, and air is filled in the gap between the first semiconductor layer 201 and the carrier 301. A first contact 800, a second contact 820, and the third insulation portion 810 separating the first contact 800 and the second contact 820 are arranged on the carrier 301. The second electrode 82 is electrically connected to the second contact 820 by the conductive layer 106. The first electrode 80 is electrically connected to the first contact 800 by the conductive layer 105. The conductive layer 105 is not connected with the conductive layer 106. The contour of the edge of the conductive layer 105 and that of the conductive layer 106 are curved in a side view.

Referring to FIG. 12, the contours of the first contact 800, the second contact 820 and the third insulation portion 810 surrounding the second contact 820 in a plane view shown in FIG. 12 are circles. The circles form a concentric structure. The concentric structure has a center C4 in a plane view shown in FIG. 12. The second contact 820 has a radius R7 measured from the center C4, and the third insulation portion 810 has a radius R8 measured from the center C4. The height of the first contact 800, the height of the second contact 820 and the height of the third insulation portion 810 are substantially the same. The top surfaces of the first contact 800, the second contact 820 and the third insulation portion 810 form a substantially flat surface. In an embodiment, the narrowest width of the third insulation portion 810 is larger than 150 µm. When the light-emitting element 30 is not correctly formed on the predetermined position of the carrier 301, a distance d between the predetermined position and the position the light-emitting element 30 located is formed. If the distance d is smaller than the narrowest width of the third insulation portion 810, no misconnection between the first electrode 80 and the second contact 820 or between the second electrode 82 and the first contact 800 happens and the light-emitting device 3000 functions properly. In another embodiment, multiple light-emitting elements 30 are arranged on the carrier 301. To be more specific, several sets of first contact 800, second contact 820 and third insulation portion 810 (separating the first contact 800 and the second contact 820) are arranged on the carrier 301. Therefore, the first contact 800 and the second contact 820 of one set are electrically connected to one light-emitting element 30. Referring to FIG. 11, the light-emitting element 30 is fixed to the carrier 301 by the conductive layers 105, 106. The first contact 800 has a contour similar with the contour of the second contact 820, the contour of the third insulation portion 810, and the contour of the second electrode 82. The contour can be a circle. In another embodiment, the contour of the depressed portion 81 and the contour of the second electrode 82 can be a rectangle, a triangle, a polygon or a closed curve. Referring to FIGS. 10, 11, 12, the radius R5 of the second electrode 82 is not larger than the radius R8 of the third insulation portion 810 to avoid electrical connection between the second electrode 82 and the first contact 800. The radius R7 of the second contact 820 is not larger than the radius R6 of the depressed portion 81 to avoid electrical connection between the first electrode 80 and the second contact 820. The two sides of the conductive layers 105, 106 are connected to the light-emitting element 30 and the carrier 301 respectively. The adhesion strength between conductive layer 105 and the first contact 800 and the adhesion strength between conductive layer 106 and the second contact 820 are larger than the adhesion strength between that between the third insulation portion 810 and the conductive layers 105, 106 when the conductive layers 105, 106 are directly connected to the third insulation portion 810. In an embodiment, the adhesion strength between conductive layer 105 and the first electrode 80 and the adhesion strength between conductive layer 106 and the second electrode 82 are larger than the adhesion strength between that between the third insulation portion 810 and the conductive layers 105, 106 when the conductive layers 105, 106 are directly connected to the third insulation portion 810. The outer surfaces of the first contact 800, the second contact 820, and the third insulation portion 810 are substantially coplanar with each other to match the substantially flat surface of the electrodes 80, 82 of the light-emitting element 30. In an embodiment, the outer surfaces of the first contact 800, the second contact 820, and the third insulation portion 810 are more depressed or protruded than the surface of the carrier 301 to match the surface profiles of the electrodes 80, 82, and the contacts 800, 820 can be tightly connected to the electrodes 80, 82.

Figure 13:
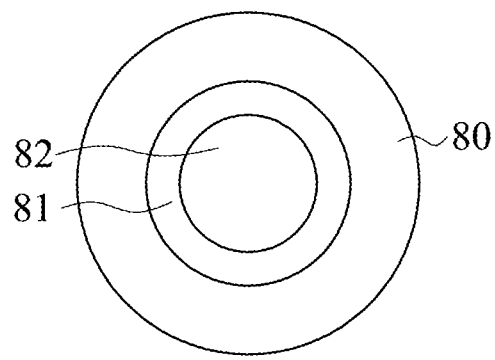
FIG. 13 shows a bottom view of a light-emitting element in accordance with an embodiment of the present disclosure.

FIG. 13 shows a bottom view of a light-emitting element in accordance with an embodiment of the present disclosure. The structure of the light-emitting element 30' is similar to that of the light-emitting element 30, and relevant descriptions can be referred to paragraphs in previous sections. The light-emitting element 30' has a circular contour. Referring to FIG. 13, the contours of the first electrode 80, the second electrode 82, and the depressed portion 81 of the light-emitting element 30' form a concentric structure. The contour of the light-emitting element 30' and the contour of the light-emitting layer (not shown) are also circular. Therefore, the optical properties of the light-emitting element 30' in all directions are substantially the same. Besides, the first electrode 80 or the second electrode 82 does not touch two contacts (for example, the first contact 800 and second contact 820 shown in FIG. 12) on a carrier (for example, the carrier 301 shown in FIG. 12) at the same time so a short circuit can be avoided even if the light-emitting element 30' is shifted when attaching the light-emitting element 30' to the carrier (for example, the carrier 301 shown in FIG. 12).

Figure 14:
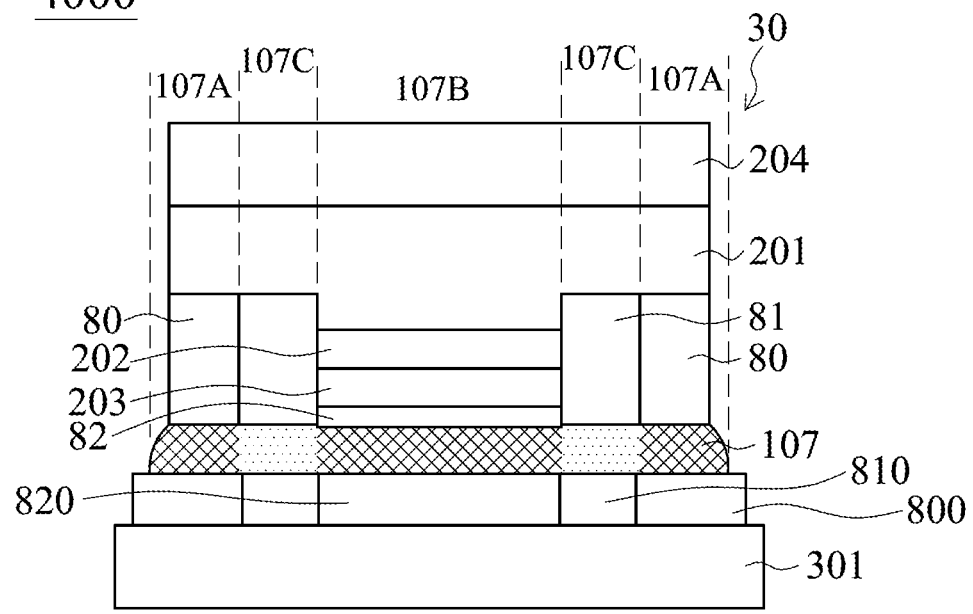
FIG. 14 shows a cross-sectional view of a light-emitting element in accordance with an embodiment of the present disclosure.

FIG. 14 shows a cross-sectional view of a light-emitting element in accordance with an embodiment of the present disclosure. The light-emitting device 4000 has a light-emitting element 30 fixed to the carrier 301 through the conductive layer 107. A first contact 800, a second contact 820, and the third insulation portion 810 separating the first contact 800 and the second contact 820 are arranged on the carrier 301. The structure of the light-emitting device 4000 is similar with that of the light-emitting device 3000, and the details of the structure can be referred to relevant paragraphs in the previous embodiments discussed above. It is noted, the conductive layer 107 is a continuous layer connecting the first electrode 80 and the carrier 301, and connecting the second electrode 82 and the carrier 301. The conductive layer 107 has a first region 107A, a second region 107B, and a third region 107C. The first region 107A electrically connects the first electrode 80 and the first contact 800 on the carrier 301. The second region 107B electrically connects the second electrode 82 and the second contact 820 on the carrier 301. The first region 107A and the second region 107B are separated from each other by the third region 107C. To be more specific, the first region 107A and the second region 107B have conductive particles of sufficient concentration and quantity to form an electrically connection between the light-emitting element 30 and the conductive region on the carrier 301 in a direction perpendicular to a surface of the carrier 301 connected to the conductive layer 107. The third region 107C has no conductive particles or has only a small amount of conductive particles not sufficient to form an electrically connection between the first region 107A and the second region 107B in a direction parallel to a surface of the carrier 301 connected to the conductive layer 107 or to form an electrically connection between the light-emitting element 30 and the conductive region on the carrier 301 in a direction perpendicular to a surface of the carrier 301 connected to the conductive layer 107. The difference of the amount or the concentration of conductive particles between the regions in the conductive layer 107 can be formed during manufacturing the light-emitting device 4000. To be more specific, the conductive particles within the conductive layer 107 are separated uniformly when the conductive material of the conductive layer 107 are arranged on the carrier 301 in the beginning of the process, and the conductive particles in the third region 107C moves toward the first region 107A and the second region 107B during the process of heating or pressing the conductive material to be the conductive layer 107 while attaching the light-emitting element 30 to the carrier 301. In another embodiment, the difference of the amount or the concentration of conductive particles between the regions in the conductive layer 107 is formed before attaching the light-emitting element 30 to the carrier 301. For example, the conductive layer 107 having different conductive particles concentrations is formed by forming a third region 107C having a lower conductive particle concentration or smaller amount of conductive particles and a first region 107A and a second region 107B having higher conductive particle concentration or larger amount of conductive particles respectively in the beginning of the process. Therefore, the electrical connection in a direction perpendicular to a surface of the carrier 301 connected to the conductive layer 107 at specific regions having higher conductive particle concentration (for example, the first region 107A and the second region 107B) can be formed. Besides, the electrical insulation between the specific regions (for example, between the first region 107A and the second region 107B) in a direction parallel to a surface of the carrier 301 connected to the conductive layer 107 can be formed at the third region 107C. In an embodiment, the height of the conductive layer 107 is not uniform, and the third region 107C is shorter than the first region 107A and the second region 107B. Referring to FIG. 14, the conductive layer 107 has a curved edge.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting device, comprising:
a light-emitting element comprising a first electrode, and a second electrode fully surrounded by the first electrode;
a carrier;
a first contact arranged on the carrier to face the first electrode;
a first conductive layer electrically connecting the first contact and the first electrode;
a second contact arranged on the carrier to face the second electrode, and surrounded by the first contact; and
a second conductive layer electrically connecting the second contact and the second electrode,
wherein the first conductive layer and the first electrode are not aligned with each other in their outermost boundaries,
wherein the second conductive layer and the second electrode are not aligned with each other in their outermost boundaries,
wherein, in a top view, the first electrode and the first contact have similar contours, and second electrode and the second contact have similar contours.

2. The light-emitting device according to claim 1, wherein the first electrode and the second electrode have similar contours.

3. The light-emitting device according to claim 1, wherein the second electrode has a circular shape.

4. The light-emitting device according to claim 1, wherein the first electrode has a circular shape.

5. The light-emitting device according to claim 1, further comprising a first insulation portion arranged between the first electrode and the second electrode.

6. The light-emitting device according to claim 5, wherein the first electrode, the second electrode, and the first insulation portion collectively have a planar bottom surface.

7. The light-emitting device according to claim 5, wherein the second electrode is surrounded by the first insulation portion.

8. The light-emitting device according to claim 5, wherein the first electrode, the second electrode, and the first insulation portion are formed in a pattern of concentric circle.

9. The light-emitting device according to claim 1, wherein the first electrode and the second electrode are formed in a pattern of concentric circle.

10. The light-emitting device according to claim 1, wherein the first electrode or the second electrode are not formed in a shape of rectangle.

11. The light-emitting device according to claim 1, wherein the first electrode is formed in a shape of rectangle.

12. The light-emitting device according to claim 1, wherein the first conductive layer, the second conductive layer, or both comprise Anisotropic Conductive film (ACF), Self Assembly Anisotropic Conductive Paste (SAP), or epoxy solder paste.

13. The light-emitting device according to claim 1, wherein the light-emitting element comprises a semiconductor stack, in the top view, the semiconductor stack and the second electrode have different contours.

14. The light-emitting device according to claim 13, wherein the semiconductor stack and the first electrode are not flush with each other in their outermost boundaries.

15. The light-emitting device according to claim 1, wherein the light-emitting element comprises a semiconductor stack, in the top view, the semiconductor stack and the second electrode have similar contours.

16. The light-emitting device according to claim 15, wherein the semiconductor stack has a circular contour in the top view.

17. The light-emitting device according to claim 1, wherein the first electrode and the second electrode have different thicknesses.

18. The light-emitting device according to claim 1, further comprising a second insulation portion formed between the first conductive layer and the second conductive layer.

19. The light-emitting device according to claim 18, wherein the second conductive layer is surrounded by the second insulation portion.

20. The light-emitting device according to claim 1, further comprising a third insulation portion formed between the first contact and the second contact.

* * * * *